(12) United States Patent
Nagatomo (10) Patent No.: US 6,243,297 B1
(45) Date of Patent: Jun. 5, 2001

(54) SEMICONDUCTOR STORAGE DEVICE

(75) Inventor: Masahiko Nagatomo, Miyazaki-gun (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/527,293

(22) Filed: Mar. 17, 2000

(30) Foreign Application Priority Data

May 20, 1999 (JP) .................................................. 11-139641

(51) Int. Cl.[7] ...................................................... G11C 11/34
(52) U.S. Cl. .................................. 365/185.25; 365/185.23
(58) Field of Search .......................... 365/185.25, 185.23, 365/185.18

(56) References Cited

U.S. PATENT DOCUMENTS 5,384,742  *  1/1995  Miyakawa ........................ 365/185.18
5,999,456  *  12/1999  Sali .................................. 365/185.28

* cited by examiner

Primary Examiner—A. Zarabian
(74) Attorney, Agent, or Firm—Rabin & Champagne, P.C.

(57) ABSTRACT

When a data write into a memory cell 11 is completed and a reset signal RST is set to level "H," a control voltage MCD output by a write control circuit 30 is set to a ground voltage GND to start a discharge of the electrical charge on the drain line DL. When a specific length of time has elapsed, a reset signal RST1 output by a delay circuit 50 is set to level "H," and an output signal from a data write circuit 40 is set to the ground voltage GND to start a discharge of the electrical charge on a source line SL. Since the electrical discharge at the drain line DL starts earlier than the discharge of the source line, the difference in the potential between the drain and the source in the memory cell 11 during a reset operation does not increase, thereby ensuring that no electrical current flows to the memory cell 11. Consequently, an erroneous data write and a delay in access occurring due to an increase in the threshold voltage can be prevented.

8 Claims, 6 Drawing Sheets

SEMICONDUCTOR STORAGE DEVICE

BACKGROUND OF THE INVENTION

The present invention relates to a semiconductor storage device, and more specifically, it relates to a write control technology that may be applied in a non-volatile memory which allows an electrical write.

Figure 2:
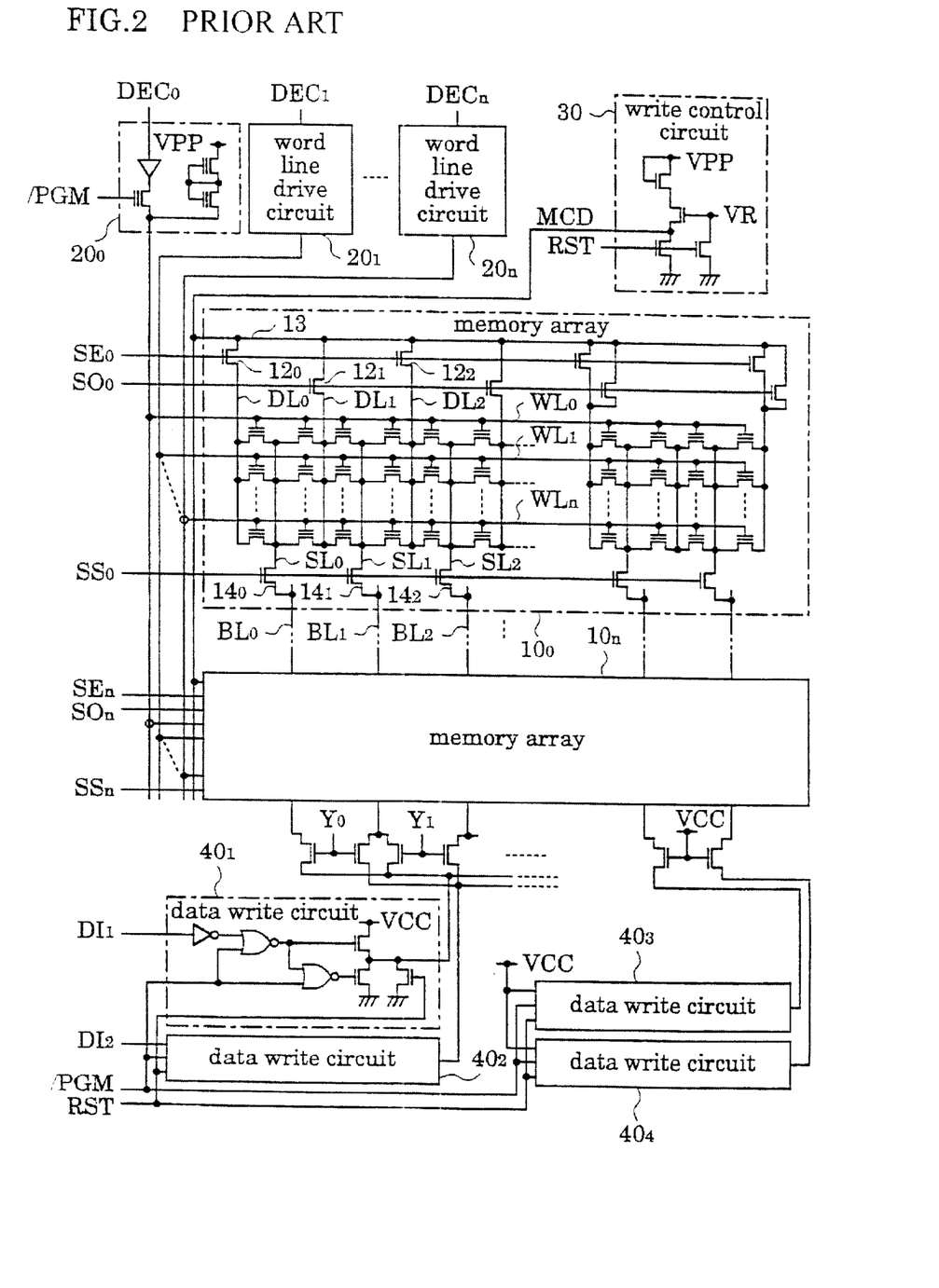
FIG. 2 is a schematic block diagram illustrating an example of an EPROM in the prior art.

FIG. 2 illustrates a schematic structure of a semiconductor storage device (e.g., an EPROM) in the prior art. In FIG. 2, the illustration of circuits such as an address decoder employed to generate a decode signal and a sense amplifier employed to read out stored data is omitted.

This EPROM is provided with a plurality of memory arrays 100, . . . 10n having structures identical to one another.

For instance, the memory array 100 is provided with word lines WL0, WL1, . . . , WLn positioned parallel to one another and drain lines DL0, DL1, . . . and source lines SL0, SL1, . . . positioned perpendicular to the word lines WL0 WLn. A memory cell 11 is connected at each intersecting point at which one of the word lines WL0~WLn and one of the drain lines DL0~intersect each other. The memory cell 11 is constituted of a field effect transistor provided with a floating gate which is insulated from other electrodes. The control gate of this field effect transistor is connected to a word line WL, its drain is connected to a drain line DL and its source is connected to a source line SL.

The individual drain lines DL0, DL1, . . . are connected to a write control line 13 via N-channel MOS transistors (hereafter referred to as "NMOSs") 120, 121 . . . respectively. The on/off control of the even-numbered NMOSs 120, . . . is achieved by an even number selection signal SE0, whereas on/off control of the odd-numbered NMOSs 121, . . . is achieved by an odd number selection signal SO0. In addition, the individual source lines SL0, SL1, . . . are respectively connected to bit lines BL0, BL1, . . . via NMOSs 140, 141, . . . the on/off states of which are controlled by a memory array selection signal SS0.

This EPROM is further provided with word line drive circuits 200, 201, . . . 20n employed to drive the individual word lines WL0~WLn respectively, a write control circuit 30 that drives the right control line 13 and data write circuits 401, 402, . . . employed to drive the bit lines BL0, BL1, . . . during a data write.

The word line drive circuits 200 20n assume structures that are identical to one another. For instance, the word line drive circuit 200 generates and outputs a selection signal for the word line WL0 in conformance to a decode signal DEC0 provided by an address decoder (not shown).

In more detail, when the decode signal DEC0 is at level "L", indicating "non-selection," the word line drive circuit 200 outputs at ground voltage GND to the word line WL0. When the decode signal DEC0 is at level "H" indicating "selection," on the other hand, the word line drive circuit 200 outputs a voltage as described below to the word line WL0 in conformance to a program mode signal/PGM ("/" indicates inversion). Namely, the word line drive circuit 200 outputs a program voltage VPP (e.g., 10 V) during a data write, whereas it outputs a source voltage VCC (e.g., 4 V) during a data read.

The write control circuit 30 outputs a control voltage MCD (=6 V) which is calculated as "source voltage VCC+ 2Vtn (Vth=approximately 1 V: the threshold voltage of the NMOS)" when a reset signal RST at level "L" is input to set the write control circuit 30 in a write operation state, and outputs the ground voltage GND when a reset signal RST at level "H" is input to set it in a reset state.

The individual data write circuits 401, . . . assume structures that are roughly identical to one another. For instance, the data write circuit 401 outputs the ground voltage GND or the source voltage VCC in conformance to the level of an input data signal DI1 (either "L" or "H") when the reset signal RST is at level "L" and a write operation has been specified by the program mode signal/ PGM. When a read operation has been specified by the program mode signal/PGM, the output side of the data write circuit 401 enters a high impedance state. In addition, when the reset signal RST is at level "H", the output side of the data write circuit 401 is connected to the ground voltage GND.

The data write operation performed by the EPROM in the prior art is now explained.

Prior to a write operation, the reset signal RST is set to level "L" and the program mode signal/PGM is set to level "H". Then, an address signal that specifies the address of a memory array in which data are to be written is provided to an address decoder (not shown). The address decoder outputs a memory array selection signal SS0 for selecting a specific memory array (e.g., the memory array 100). Also, the decode signal DEC0 for selecting one of the word lines (e.g., the word line WL0) in the memory array 100 is provided to the word line drive circuit 200. An input data signal DI1 (with its level at, for instance, "L") and an input data signal DI2 (with its level at, for instance, "H") constituting the data to be written are respectively provided to the data write circuits 401 and 402.

The memory array 100, which has been selected by the memory array selection signal SS0, becomes connected to the bit line BL, whereas the memory arrays 101~10n that have not been selected are disconnected from the bit line BL. In addition, a selection signal at the source voltage VCC (4 V) is commonly applied to the control gates of all the memory cells 11 connected to the selected word line WL0 by the word line drive circuit 20. The control voltage MCD at 6 V is applied to the drain of a selected memory cell 11 by the write control circuit 30, whereas the source becomes connected to the data write circuit 40 via the source line SL and the bit line BL.

Next, the program mode signal/PGM is set to level "L" over a specific length of time, and the data write operation starts. When the program mode signal/PGM is set to level "L", the selection signal output to the word line WL0 by the word line drive circuit 200 is set to the program voltage VPP (10 V). In addition, the voltages output by the data write circuits 401 and 402 to the bit lines BL1 and BL2 respectively are set to the ground voltage GND and "the source voltage VCC—the threshold voltage Vth" in correspondence to the data that are input.

The program voltage VPP (=10 V) is applied to the control gate of the memory cell 11 that is selected with the address signal and specified to have the input data DI1 at level "L" written therein, with the control voltage MCD (=6 V) applied to its drain and the ground voltage GND applied to its source. In this memory cell 11, since a large difference in the potential (10 V) occurs between its control gate and its source and a large difference in the potential (6 V) occurs between its drain and its source, some of the elections flowing between the drain and the source become accelerated to gain energy, and thus they jump the energy barrier constituted of the gate insulating film to be injected into the floating gate.

The program voltage VPP (=10 V) is applied to the control gate of the memory cell 11 that is selected with the address signal and specified to have the input data DI2 at level "H" written therein, with the control voltage MCD (=6 V) applied to its drain and "the source voltage VCC~the threshold voltage Vth (=3 V)" applied to its source. In this case, since the difference in the potential between the control gate and the source is 7 V and the difference in the potential between the drain and the source is 3 V, the level of the energy of the electrons flowing between the drain and the source is low and, consequently, the electrons are not injected into the floating gate.

When the data write to the word line WL0 at the memory array 100 specified with the address signal is completed, the program mode signal/PGM is set to level "H" and the reset signal RST is set to level "H." When the reset signal RST is set to level "H," the output voltages from the write control circuit 30 and the data write circuit 40 are set to the ground voltage GND. This causes the electrical charges stored at the write control line 13 and the bit line BL to become released. However, the electrical charge at the floating gate of the memory. cell 11 where the input data at level "L" have been written is sustained.

When the electrical. discharge from the write control line 13 and the bit line BL is completed, a data write operation is performed on the memory cell which is to undergo the next data write.

However, the EPROM in the prior art poses the following problems to be addressed.

Generally speaking, if the memory capacity is increased, the wiring pattern of the write control line 13 is bound to also increase to result in a higher capacitance at the write control line 13. However, since the wiring pattern of the bit line BL does not extend as much as that of the write control line 13 even when the memory capacity is increased, a large difference occurs between the capacitance at the write control line 13 and the capacitance at the bit line BL. When the reset signal RST is used to cause the electrical charges stored at the write control line 13 and the bit line BL to be released after a data write operation is completed, the discharge of the drain line DL (the write control line 13) becomes delayed relative to the discharge of the source line SL (bit line BL), and as a result, the voltage at the source line SL becomes lower before the voltage at the drain line DL is reduced. This time lag in the voltage reduction causes a current to flow from the drain of the memory cell 11 to the source. Thus, even when writing input data DI at level "H" in the memory cell, electrons may be injected into the floating gate of the memory cell 11 to result in a write of erroneous data. In addition, if an unstable current causes a small quantity of electrons to be injected into the floating gate, the threshold voltage Vth of the memory cell 11 is raised, to lead to problems such as an increase in the access time and a narrower power operating range.

SUMMARY OF THE INVENTION

Accordingly, an object of the present invention, which has been completed by addressing the problems discussed above, is to provide a semiconductor storage device in which problems such as an erroneous write and an access delay do not occur.

In order to achieve the object described above, the semiconductor storage device according to the present invention comprises a plurality of word lines positioned parallel to one another and each provided with a selection signal for memory cell selection, a plurality of drain lines and a plurality of source lines positioned perpendicular to the word lines, a plurality of memory cells each positioned at an intersecting point at which one of the plurality of word lines and one of the plurality of source lines intersect, each provided with a control gate connected to the word line, a source connected to the source line, a drain connected to the drain line and a floating gate and each constituted of a field effect transistor that holds data by using the electrical charge stored at the floating gate even after power is cut off, and a means for word line drive that generates the selection signal in conformance to an address signal for specifying a memory cell to undergo a data write to drive the word line.

The semiconductor storage device is further provided with a means for write control that supplies a control voltage for data write to the memory cell selected with the selection signal via the drain line and discharge on the drain line in conformance to a first reset signal when the write is completed, a. means for data write that supplies a write voltage corresponding to the logic value of the data to be written to the memory cell selected with the selection signal via the source line and discharge on the source line in conformance to a second reset signal when the write is completed and a means for delay that generates the second reset signal by delaying the first reset signal by a specific length of time.

In addition, the means for delay in the semiconductor storage device outputs the second reset signal when the voltage at the drain line is detected to have fallen to a level equal to or lower than a specific value after the first reset signal is provided.

In this structure, when the first reset signal is provided after a data write is completed, the electrical charge that has been stored at the drain line is discharged by the means for write control. The means for delay generates the second reset signal by delaying the first reset signal by a specific length of time and provides it to the means for data write. This second reset signal causes the electrical charge stored at the source line to be released.

Alternatively, the semiconductor storage device according to the present invention, which comprises a plurality of word lines, a plurality of drain lines, a plurality of source lines and a plurality of memory cells is characterized by a means for word line drive, a means for write control and a means for data write that it is further provided with.

The means for word line drive drives the word line by generating the selection signal based upon an address signal for specifying a memory cell to undergo a data write. The means for write control outputs a control voltage for data write to the write control line during a data write to supply the control voltage to the memory cell selected with the selection signal via the drain line and discharge on the drain line in conformance to a reset signal after the write is completed. The means for data write supplies a write voltage. corresponding to the logic value of the data to be written to the memory cell selected with the selection signal via the source line and connects the source line to the write control line in conformance to the reset signal after the write is completed.

In this structure, when the reset signal is provided after a write is completed, the source line becomes connected with the write control line by the means for data write and the electrical charge on the drain line is discharged by the means for write control.

In addition, the means for word line drive in the semiconductor storage device switches the word line into a non-selection state when the reset signal or the first reset signal is provided. This structure allows a word line connected to the means for word line drive to be switched into a non-selection state by the reset signal or the first reset signal.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

The following is a detailed explanation of the preferred embodiments of the semiconductor storage device according to the present invention, given in reference to the attached drawings. It is to be noted that the same reference numbers are assigned to components achieving roughly the same functions and structural features in the following explanation and the attached drawings to preclude the necessity for a repeated explanation thereof.

First Embodiment

Figure 1:
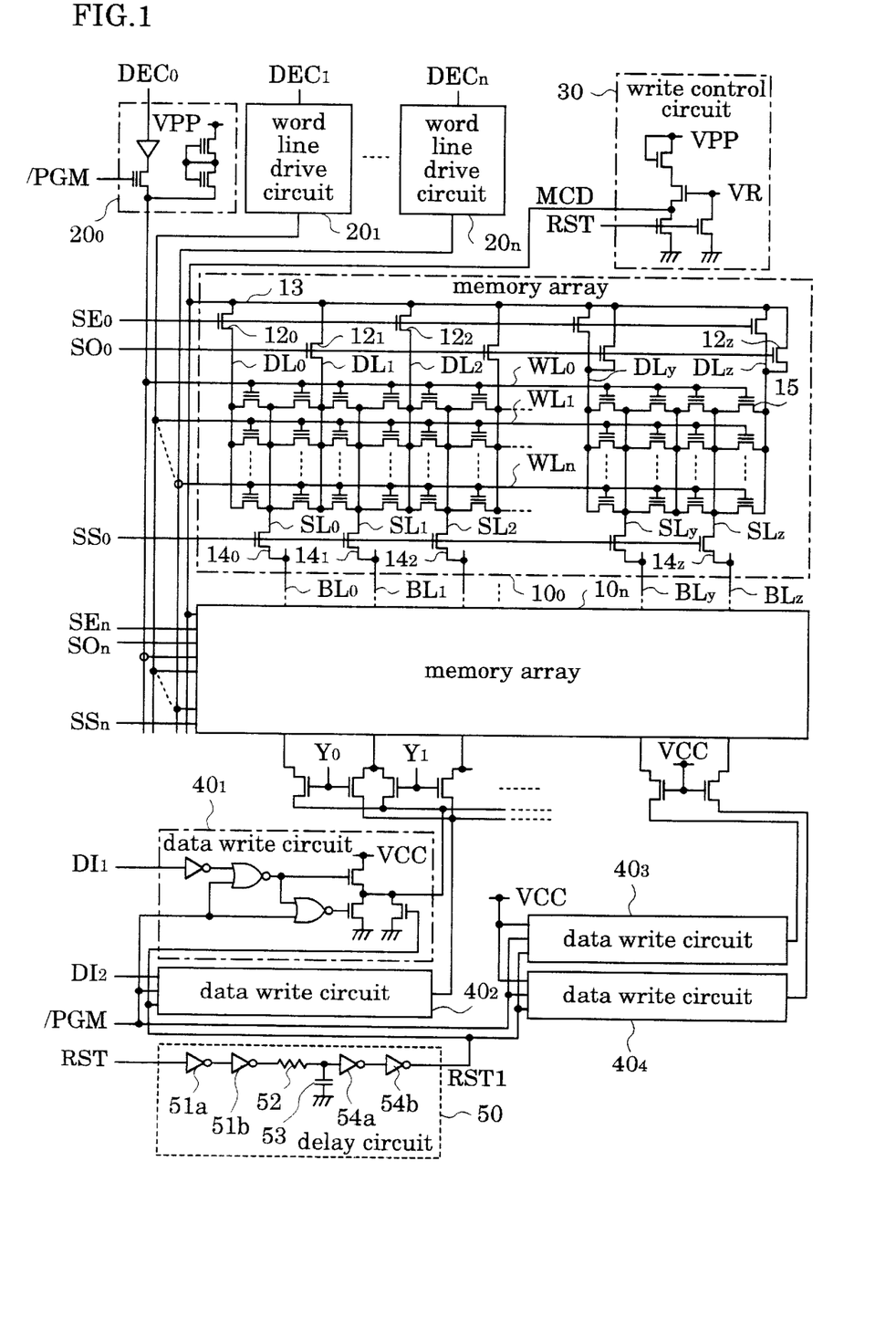
FIG. 1 is a schematic block diagram of the EPROM in the first embodiment of the present invention.

FIG. 1 illustrates a schematic structure of the EPROM in the first embodiment of the present invention. It is to be noted that in FIG. 1, the illustration of circuits such as an address decoder employed to generate a decode signal and a sense amplifier employed to read out stored data is omitted.

The EPROM in the first embodiment, which adopts a sub-array system, is provided with a plurality of memory arrays 100, . . . , 10n having structures that are roughly identical to one another.

For instance, the memory array 100 is provided with word lines WL0, WL1, . . . , WLn positioned parallel to one another, drain lines DL0, DL1, . . . , Dly, Dlz and source lines SL0, SL1 . . . , SLy, SLz positioned perpendicular to the word lines WL0~WLn. The drain lines DL0, DL1, . . . and the source lines SL0, SL1 . . . , are provided alternately.

A memory cell 11 to be used for data storage is connected at each intersecting point at which one of the word lines WL0~WLn and one of the drain lines DL0 . . . intersect. In addition, a memory cell 15 that generates a reference potential for a read is connected at each intersecting point where one of the word lines WL0~WLn and one of the drain lines DLy and DLz intersect. The memory cells 11 and 15 are each constituted of a field effect transistor provided with a floating gate insulated from other electrodes, with its control gate connected to a word line WL, its drain connected to a drain line DL and its source connected to a source line SL.

The drain lines DL0~DLz are respectively connected to a write control line 13 via NMOSs 120, 121, . . . , 12z for switching. The on/off control of the even-numbered NMOSs 120, . . . is achieved by an even number selection signal SE0 and the on/off control of the odd-numbered NMOSs 121 . . . is achieved by an odd number selection signal SO0. In addition, the source lines SL0~SLz are respectively connected to bit lines BL0, BL1, . . . BLy and BLz via NMOSs 140, 141, . . . , 14z. The on/off states of these NMOSs 140~14z are controlled by a memory array selection signal SS0.

The EPROM in the first embodiment is further provided with means for word line drive (e.g., word line drive circuits) 200, 201, . . . , 20n that drive the word lines WL0~WLn respectively, a means for write control (e.g., a write control circuit) 30 that drives a write control line 13, means for data write (e.g., data write circuits) 401, 402, 403 and 404 that drive the bit lines BL0~BLz during a data write and a means for delay (e.g., a delay circuit) 50 that delays a discharge start at the bit lines BL0~BLz after a write is completed.

The individual word line drive circuits 200~20n assume structures identical to one another and, for instance, the word line drive circuit 200 generates and outputs a selection signal for the word line WL0 in conformance to a decode signal DEC0 provided by an address decoder (not shown). In more specific terms, when the decode signal DEC0 is at level "L" indicating "non-selection", the word line drive circuit 200 outputs a ground voltage GND to the word line WL0. If, the decode signal DEC0 is at level "H" indicating "selection," on the other hand, the word line drive circuit 200 outputs a voltage as described below to the word line WL0 in conformance to a program mode signal/PGM. Namely, the word line drive circuit 200 outputs a program voltage VPP (e.g., 10 V) during a data write, whereas it outputs a source voltage VCC (e.g., 4 V) during a data read.

The write control circuit 30 outputs a control voltage MCD (=6 V) achieved as source voltage VCC+2Vtn (Vth= approximately 1 V: the threshold voltage of the NMOS) when a reset signal RST at level "L" is input to set it in a write operation stat, whereas it outputs the ground voltage GND when a reset signal RST at level "H" is input to set it in a reset state.

The individual data write circuits 401~404 assume structures that are roughly identical to one another. For instance, the data write circuit 401 outputs the ground voltage GND or the source voltage VCC in conformance to the level of an input data signal DI1 (either "L" or "H") when a reset signal RST1 is at level "L" and a write operation has been specified by the program mode signal/PGM. When a read operation has been specified by the program mode signal/PGM, the output side of the data write circuit 401 enters a high impedance state. In addition, when the reset signal RST is at level "H", the output side of the data write circuit 401 is connected to the ground voltage GND. The input sides of the data write circuits 403 and 404, which are connected to the source voltage VCC, are provided with level "H." Also, the output sides of the data write circuits 403 and 404 are connected to the bit lines BLy and BLz respectively.

The delay circuit 50 is provided with inverters 51a and 51b constituting an input-side buffer amplifier, a resistor 52 and a capacitor 53 constituting an integrating circuit and inverters 54a and 54b constituting an output-said buffer amplifier. The delay circuit 50 delays the reset signal RST provided to its input side by a specific length of time and outputs a reset signal RST1 through its output side. The reset signal RST1 is provided to the data write circuits 401~404.

Figure 3:
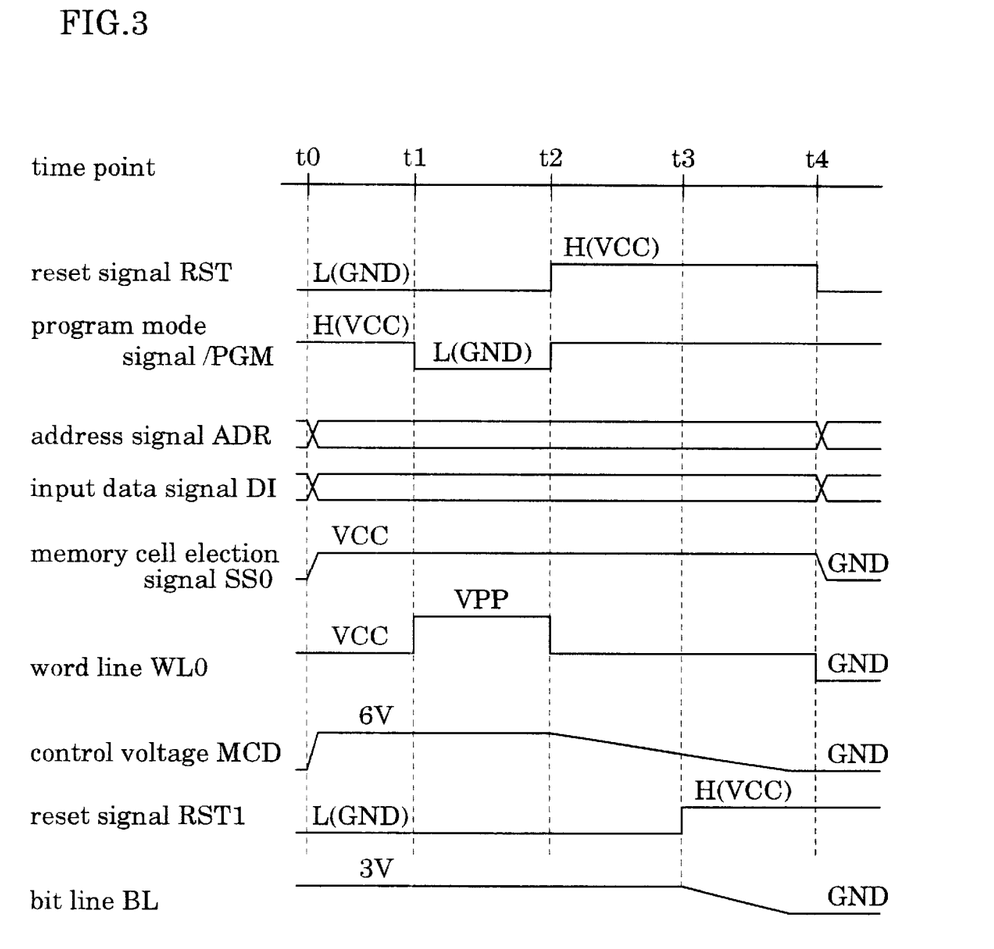
FIG. 3 is a signal waveform diagram corresponding to a write operation performed by the EPROM in FIG. 1.

FIG. 3 presents signal waveforms achieved during a data write operation performed by the EPROM in the first embodiment illustrated in FIG. 1.

The following is an explanation of the data write operation achieved in the EPROM in the first embodiment shown in FIG. 1, given in reference to FIG. 3.

At a time point t0 in FIG. 3, the reset signal RST is set to the ground voltage and the program mode signal/PGM is set to the source voltage VCC. An address signal ADR that specifies a data write address is provided to an address decoder (not shown). In addition, an input data signal DI1 (with its level at, for instance, "L") and an input data signal DI2 (with its level at, for instance, "H") constituting write data are respectively provided to the data write circuits 401 and 402.

A memory array selection signal SS0 for selecting a specific memory array (e.g., the memory array 100) is output by the address decoder. Also, a decode signal DEC0 for selecting one word line (e.g., the word line WL0) in the memory array 100 is provided to the word line drive circuit 200. The memory array 100 selected with the memory array selection signal SS0 become connected to the bit line BL, whereas the memory arrays 101~10n that have not been selected are disconnected from the bit line BL. A selection signal at the source voltage VCC (4 V) is commonly applied to the control gates of the memory cells 11 connected to the selected word line WL0 by the word line drive circuit 20. A control voltage MCD at 6 V is applied to the drain of a selected memory cell 11 from the write control circuit 30. The source of the selected memory cell 11 is connected to the data write circuit 40 via the source line SL and bit line BL.

At a time point tl, the program mode signal/PGM is set to level "L" and a data write operation starts. When the program mode signal/PGM is set to level "L," the selection signal output by the word line drive circuit 200 to the word line WL0 is set to the program voltage VPP (10 V). In addition, the voltages output by the data write circuits 401 and 402 to the bit lines BL1 and BL2 respectively are set to the ground voltage GND or a voltage expressed as the source voltage VCC—threshold voltage Vth, in correspondence to the levels of the input data signals DI1 and DI2. It is to be noted that the voltages of the word lines WL1~WLn that are not selected and, therefore, not driven are set to the ground voltage GND.

The program voltage VPP (=10 V) is applied to the control gate of the memory cell 11 that is selected with the address signal ADR and specified to have the input data DI1 at level "L" written therein, with the control voltage MCD (=6 V) applied to its drain and the ground voltage GND applied to its source. In this memory cell 11, since a large difference in the potential (10 V) occurs between its control gate and its source and a large difference in the potential (6 V) occurs between its drain and its source, some of the electrons flowing between the drain and the source become accelerated to gain energy, and thus they jump the energy barrier constituted of the gate insulating film to be injected into the floating gate.

The program voltage VPP (=10 V) is applied to the control gate of the memory cell 11 that is selected with the address signal ADR and specified to have the input data DI1 at level "H" written therein, with the control voltage MCD (=6 V) applied to its drain and "the source voltage VCC—the threshold voltage Vth (=3 V)" applied to its source. In this case, since the difference in the potential between the control gate and the source is 7 V and the difference in the potential between the drain and the source is 3 V, the level of the energy of the electrons flowing between the drain and the source is low and, consequently, the electrons are not injected into the floating gate.

At a time point t2 at which a required length of time for the data write has elapsed, the program mode signal/PGM is set to level "H," and the reset signal RST provided to the write control circuit 30 and the delay circuit 50 is set to level "H." When the level of the reset signal RST is at "H," the output voltage of the write control circuit 30 is set to the ground voltage GND. Thus, a discharge of the electrical charge stored at the write control line 13 starts, causing the control voltage MCD to become lower in conformance to a specific time constant.

At a time point t3 at which a specific length of time has elapsed after the time point t2, the reset signal RST1 output by the delay circuit 50 is set to level "H." The output voltages from the data write circuits 401~404 are set to the ground voltage GND, a discharge of the electrical charge stored at the bit line BL starts and the voltage at the bit line BL is lowered in conformance to a specific time constant.

When the discharge of the write control line 13 and the bit line BL is completed at a time point t4, the reset signal RST is reset to level "L." At this time, the electrical charge at the floating gate of the memory cell 11 having the input data at level "L" written therein is sustained. Through this process, a data write operation on a memory cell to undergo the next data write is enabled.

In order to read out data written in the memory cell 11, the program mode signal/PGM is set to level "H" to set the EPROM in a read mode. Then, a memory array 10 and a word line WL are selected with an address signal ADR. The source voltage VCC is applied as a selection signal to the selected word line WL. In addition, the output side of the data write circuit 40 is set in a high impedance state and is electrically disconnected from the bit line. The threshold voltage Vth of the selected memory cell 11 varies depending upon the quantity of electrons injected into its floating gate. Thus, the level of the current flowing to the bit line BL from the source via the source line SL varies depending upon the data that have been written. An electrical current corresponding to the data set to level "H" is output from a memory cell 15 that generates the reference potential. Then, the sense amplifier (not shown) compares the value of the current output by the memory cell 11 against the value of the current output by the memory cell 15 to decide as to whether data at level "L" or at level "H" are stored in the memory cell 11 and reads out the stored data.

As explained above, the EPROM in the first embodiment is provided with the delay circuit 50, which causes the electrical charges on the bit line BL and the source line SL to be released when the discharge of the electrical charge stored at the write control line 13 and the drain line DL has advanced to a certain point at the time of a reset after a data write operation is completed. This structure ensures that no large difference in the potential occurs between the drains and the sources of the memory cells 11 and 15 at the time of a reset and thus suppresses the flow of current from the drains to the sources. Thus, an erroneous write of data in the memory cell 11 is prevented. In addition, since the threshold voltage Vth does not rise at the memory cells 11 and 15, problems such as delayed access and fluctuations of the power operating range are eliminated.

Second Embodiment

Figure 4:
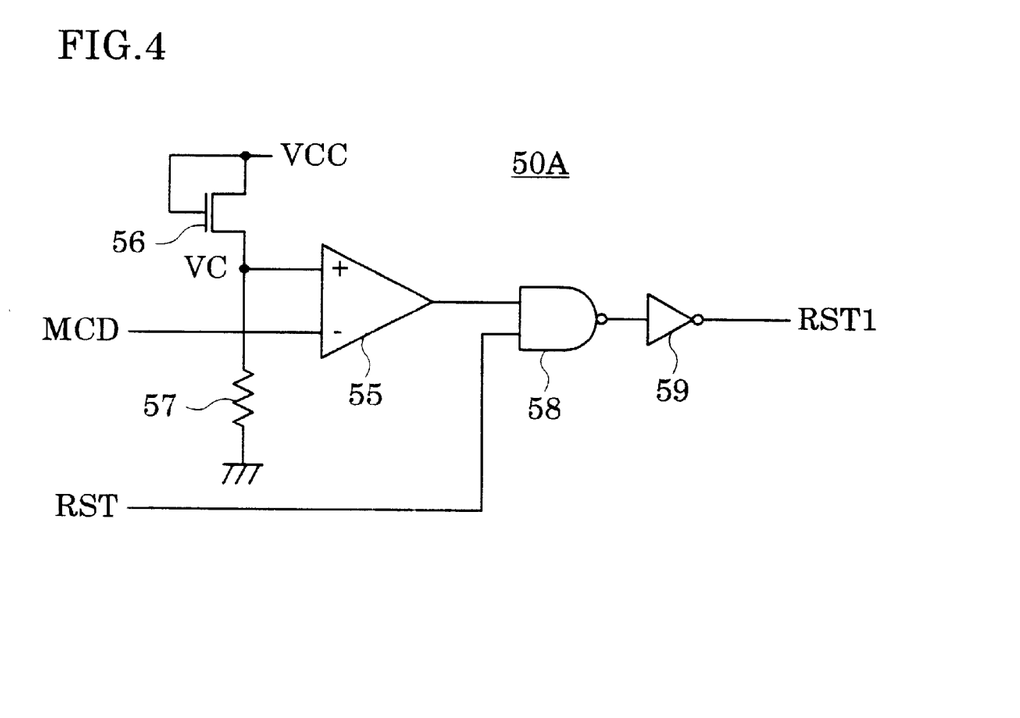
FIG. 4 is a circuit diagram of the delay circuit 50A provided in the EPROM in a second embodiment of the present invention.

FIG. 4 illustrates the circuit structure of a delay circuit 50A provided in the EPROM in the second embodiment of the present invention.

The EPROM in the second embodiment assumes a structure achieved by replacing the delay circuit 50 in the EPROM in the first embodiment illustrated in FIG. 1 with the delay circuit 50A. A voltage comparator 55 provided at the delay circuit 50A outputs a signal at level "H" through the output terminal when the voltage supplied to its /–input terminal is lower than the voltage supplied to its +input terminal and outputs a signal at level "L" through the output terminal when the voltage supplied to the –input terminal is higher than the voltage supplied to the +input terminal. A control signal MCD from the write control circuit 30 is provided to the /–input terminal of the voltage comparator 55, whereas a constant voltage VC generated at an NMOS 56 and a resistor 57 is supplied to the +input terminal.

The output side of the voltage comparator 55 is connected to a first input side of a 2-input NAND gate (hereafter referred to as a "NAND") 58. A reset signal RST is provided to a second input side of the NAND 58. An inverter 59 that outputs a reset signal RST1 is connected to the output side of the NAND 58.

The delay circuit 50A outputs the reset signal RST1 at level "H" when the reset signal RST is at level "H" and the control signal MCD has fallen to a level equal to or lower than the constant voltage VC. As a result, by setting the voltage VC at an appropriate level, it is possible to prevent a large difference in the potential from occurring between the drains and the sources in the memory cells 11 and 15 at the time of a reset with a high degree of reliability. As explained above, the EPROM in the second embodiment achieves advantages similar to those achieved by the EPROM in the first embodiment. Furthermore, since a reduction in the voltage of the control signal MCD can be detected in the EPROM in the second embodiment, a high degree of reliability can be assured during a data write operation and a data read operation regardless of the length and the like of the wiring pattern of the write control line 13.

Third Embodiment

Figure 5:
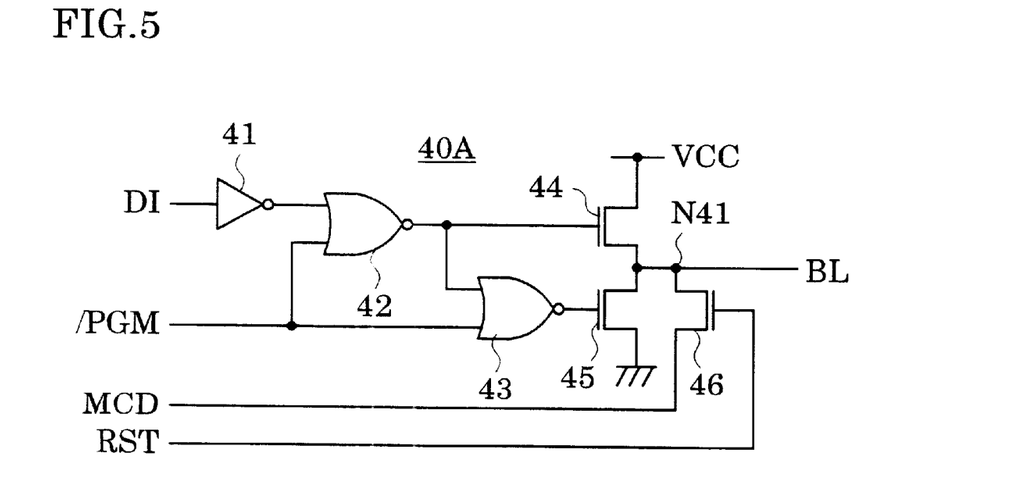
FIG. 5 is a circuit diagram of the data write circuit 40A provided in the EPROM in a third embodiment of the present invention.

FIG. 5 illustrates the circuit structure of a data write circuit 40A provided in the EPROM in the third embodiment of the present invention.

The EPROM in the third embodiment assumes a structure achieved by replacing the data write circuit 40 in the EPROM in the first embodiment shown in FIG. 1 or in the EPROM in the prior art shown in FIG. 2 with the data write circuit 40A. The data write circuit 40A has an inverter 41 which receives an input data signal DI. The output side of the inverter 41 is connected to a first input side of a 2-input NOR gate (hereafter referred to as a "NOR") 42. The output side of the NOR 42 is connected to a first input side of a 2-input NOR 43. A program mode signal/PGM is provided to the second output sides of the NORs 42 and 43. In addition, the output sides of the NORs 42 and 43 are respectively connected to the gates of NMOSs 44 and 45. The drain of the NMOS 44 is connected to the source voltage VCC, whereas its source is connected to a node N41. The drain of the NMOS 45 is connected to the node N41, whereas its source is connected to the ground voltage GND.

In addition, the drain of an NMOS 46 is connected to the node N41. The control signal MCD from the write control circuit 30 is provided to the source of the NMOS 46 and the reset signal RST is provided to its gate. In addition, the data write circuit 40A outputs an output signal DO through the node N41.

In the data write circuit 40A, the NMOS 46 enters an off state when the level of the reset signal RST is at "L." At this time, the data write circuit 40A operates as do the data write circuit 40 shown in FIGS. 1 and 2. Namely, when the program mode signal/PGM is set to level "L," the NMOSs 44 and 45 are set in an off state and the node N41 is set in a high-impedance state. When the program mode signal/PGM is set to level "H," on the other hand, the ground voltage GND or the voltage expressed as source voltage VCC /–threshold voltage Vth is output through the node N41 in conformance to the level of the input data signal DI, i.e., in conformance to whether the level is "L" or "H."

When the reset signal RST is set to level "H," the NMOS 46 is set in an on state and the control signal MCD is applied to the node N41. Then, the output voltage VO is output to the bit line BL through the node N41. Thus, the voltage at the source line SL and the voltage at the drain line DL in the memory array 10 are equalized, and thus, it is ensured that no current flows to the memory cells 11 and 15. As explained above, the EPROM in the third embodiment achieves advantages similar to those achieved by the EPROM in the second embodiment.

Fourth Embodiment

Figure 6:
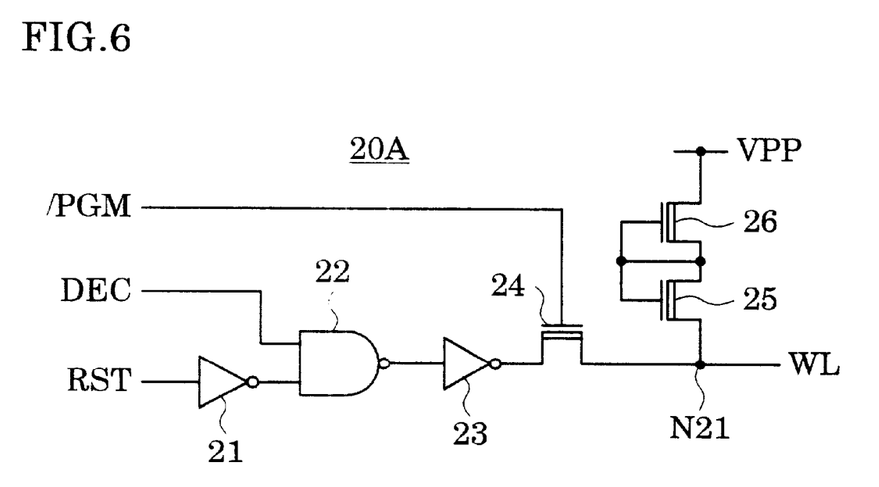
FIG. 6 is a circuit diagram of a word line drive circuit 20A provided in the EPROM in a fourth embodiment of the present invention.

FIG. 6 illustrates the circuit structure of a word line drive circuit 20A provided in the EPROM in the fourth embodiment of the present invention.

The EPROM in the fourth embodiment assumes a structure achieved by replacing the word line drive circuit 20 in the EPROM in the first embodiment illustrated in FIG. 1 or the EPROM in the prior art illustrated in FIG. 2 with the word line drive circuit 20A. The word line drive circuit 20A is provided with an inverter 21 that receives a reset signal RST. The output side of the inverter 21 is connected to a first input side of a NAND 22. A decode signal DEC is provided to a second input side of the NAND 22. The output side of the NAND 22 is connected to the drain of a depression type MOS transistor ((hereafter referred to as a "DMOS") 24 via an inverter 23. The source of the DMOS 24 is connected to a node N21. A program mode signal/PGM is provided to the gate of the DMOS 24. A program voltage VPP is supplied to the node N21 via DMOSs 25 and 26 that are connected in series. In addition, the node N21 is connected to the word line WL.

When the reset signal RST is set to "H" in the word line drive circuit 20A at the time of a reset, the level of the output signal from the inverter 23 is set to "L," thereby setting the node N21 to the ground voltage GND. As the node N21 is set to the ground voltage GND, all the word lines WL in the memory array 10 are set to the ground voltage GND and, as a result, no current flows to the memory cells 11 and 15. As explained above, the EPROM in the fourth embodiment achieves advantages almost identical to those achieved by the EPROM in the second embodiment.

Fifth Embodiment

Figure 7:
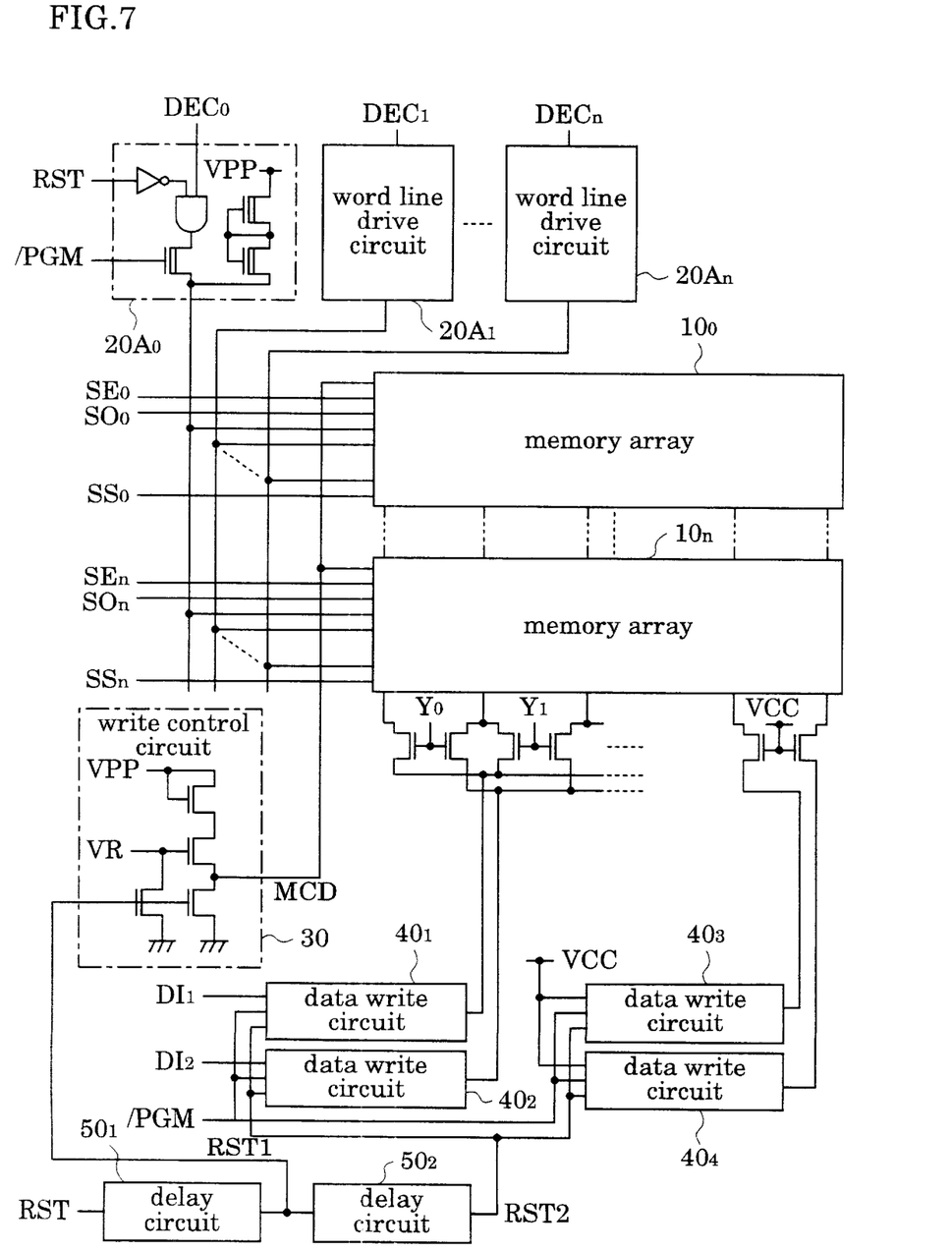
FIG. 7 is a schematic diagram of the EPROM in a fifth embodiment of the present invention.

FIG. 7 illustrates a schematic structure of the EPROM in the fifth embodiment of the present invention.

The EPROM in the fifth embodiment assumes a structure achieved by replacing the word line drive circuit 20 and the delay circuit 50 in the EPROM in the first embodiment shown in FIG. 1 with a word line drive circuit 20A and delay circuits 501 and 502 respectively. The delay circuits 501 and 502, each assuming a circuit structure practically identical to that of the delay circuit 50, are connected in series. The delay circuit 501 to which a reset signal RST is input provides a reset signal RST1 to the write control circuit 30 and the delay circuit 502. The delay circuit 502 to which the reset signal RST1 is input provides a reset signal RST2 to the data write circuits 401~404.

When the reset signal RST is set to level "H" at the time of a reset in the EPROM in the fifth embodiment, the word line drive circuit 20A first sets the selected word line WL to the ground voltage GND. Then, discharge of the electrical charge stored at this word line WL starts. Next, the reset signal RST1 is input to the write control circuit 30 which then outputs a control signal MCD set to the ground voltage GND. The control signal MCD with its level at the ground voltage GND is input to the memory array 10 to start discharge of the electrical charge stored at the drain line DL. Then, the reset signal RST is input to the data write circuits 401~404 and the electrical charge stored at the source line SL is caused to be released. As explained above, the EPROM in the fifth embodiment achieves advantages almost identical to those achieved by the EPROMs in the first and second embodiments.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

(a)~(c) below, for instance, may be adopted in other embodiments of the present invention.
(a) The present invention is not restricted to application in an EPROM, and may be adopted in a semiconductor storage device such as a non-volatile memory (EEPROM) which allows an electrical batch erasure and electrical batch write.
(b) The structure of the memory array 10 is not restricted to that illustrated in FIG. 1.
(c) The structures of the word line drive circuit 20, the write control circuit 30, the data write circuit 40 and the delay circuit 50 are not restricted to those explained earlier, which are given merely as examples, and they may assume any structure as long as they fulfill a similar function.

As has been explained in detail, the semiconductor storage device according to the present invention is provided with a means for delay that generates a second reset signal by delaying a first reset signal by a specific length of time and a means for data write that causes an electrical charge on a source line to discharge by using the second reset signal. Thus, no large difference in the potential occurs between the drain line and the source line and, consequently, no electrical current flows to the memory cells at the time of a reset to prevent an erroneous data write and the like.

The semiconductor storage device according to the present invention is provided with a means for delay that outputs a second reset signal when the voltage at the drain line has fallen equal to or lower than a specific value. In addition, the semiconductor storage device according to the present invention is provided with a means for data write that connects the source line to the write control line in conformance to the reset signal. This structure ensures that no difference in the potential occurs between the drain line and the source line so that an erroneous write and the like can be prevented with a high degree of reliability.

Moreover, the semiconductor storage device according to the present invention is provided with a means for word line drive that switches the word line to a non-selection state in response to a reset signal. As a result, an erroneous write of data into a memory cell is prevented from occurring at the time of a reset.

The entire disclosure of Japanese Patent Application No. 11-139641 filed on May 20, 1999 including specification, claims, drawings and a summary is incorporated herein by reference in its entirety.

What is claimed:

1. A semiconductor storage device, comprising:
   a plurality of word lines;
   a plurality of first control lines;
   a plurality of second control lines;
   a memory cell array that has a plurality of memory cells, each of said plurality of memory cells comprising a control gate, a drain terminal and a source terminal, wherein said control gate is connected to a respective one of said word lines, wherein said drain terminal is connected to a respective one of said first control lines, and wherein said source terminal is connected to a respective one of said second control lines;
   a word line drive circuit that drives said word lines;
   a write control circuit that drives said first control lines;
   a data write circuit that drives said second control lines when data is being written into a respective one of said memory cells; and
   a delay circuit that discharges the voltage on said second control lines after the voltage on said first control lines is discharged to a predetermined threshold level when said data writing is finished.

2. The semiconductor storage device in accordance with claim 1, wherein said delay circuit delays a reset signal by a predetermined time in order to discharge the voltage on said second control lines.

3. The semiconductor storage device in accordance with claim 2, wherein said delay circuit has a plurality of inverters and a resistor serially coupled with said inverters.

4. A semiconductor storage device, comprising:
   a plurality of word lines;
   a plurality of drain lines;
   a plurality of source lines;
   a write control line which is connected to said drain lines in accordance with a selection signal;
   a plurality of bit lines which are connected to said source lines in accordance with a memory cell array selection signal;
   a memory cell array that has a plurality of memory cells each comprising a control gate, a drain terminal and a source terminal, wherein said control gate is connected to a respective one of said word lines, wherein said drain terminal is connected to a respective one of said drain lines, and wherein said source terminal is connected to a respective one of said source lines;
   a word line drive circuit that selects said word lines in accordance with a decode signal and drives said word lines in accordance with a program mode signal;
   a write control circuit that drives said write control line in accordance with a reset signal;
   a delay circuit that delays said reset signal by a predetermined time and outputs said delayed reset signal; and
   a data write circuit that drives said bit lines in accordance with said delayed reset signal and said program mode signal.

5. The semiconductor storage device in accordance with claim 4, wherein said delay circuit has a voltage comparator that compares a voltage level on said write control line with a predetermined voltage level and outputs the comparison result, and a logic operation part that performs a logic operation between said comparison result and said reset signal.

6. The semiconductor storage device in accordance with claim 4, wherein said data write circuit has an NMOS transistor that has a control gate that receives said reset signal, a source terminal connected to said write control lines and a drain terminal connected to said bit lines.

7. The semiconductor storage device in accordance with claim 4, wherein said word line drive circuit has a logic operation part that performs a logic operation between said decode signal and said reset signal and outputs a logic operation result, and an NMOS transistor having a control gate that receives said program mode signal, a source terminal that receives said logic operation result and a drain terminal connected to said word line.

8. A semiconductor storage device, comprising:

a plurality of word lines;

a plurality of first control lines;

a plurality of second control lines;

a memory cell array which has a plurality of memory cells each comprising a control gate, a drain terminal and a source terminal, wherein said control gate is connected to a respective one of said word lines, wherein said drain terminal is connected to a respective one of said first control lines, and wherein said source terminal is connected to a respective one of said second control lines;

a word line drive circuit that drives said word lines in accordance with a reset signal;

a first delay circuit that delays said reset signal by a predetermined time and outputs a first delayed reset signal;

a second delay circuit that delays said first delayed reset signal by a predetermined time and outputs a second delayed reset signal;

a data write circuit that drives said second control line based on said second delayed reset signal; and a write control circuit that drives said first control line based on said first delayed reset signal.

* * * * *